(12) United States Patent
Mochizuki

(10) Patent No.: US 11,563,297 B2
(45) Date of Patent: Jan. 24, 2023

(54) POGO BLOCK WITHIN THE INTERMEDIATE CONNECTION MEMBER OF AN INSPECTION SYSTEM

(71) Applicant: Tokyo Electron Limited, Tokyo (JP)

(72) Inventor: Jun Mochizuki, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 125 days.

(21) Appl. No.: 17/210,740

(22) Filed: Mar. 24, 2021

(65) Prior Publication Data
US 2021/0305761 A1 Sep. 30, 2021

(30) Foreign Application Priority Data

Mar. 27, 2020 (JP) .............................. JP2020-058492

(51) Int. Cl.
*H01R 31/00* (2006.01)
*H01R 9/24* (2006.01)
*H01R 13/631* (2006.01)
*H01R 13/24* (2006.01)

(52) U.S. Cl.
CPC ............ *H01R 31/005* (2013.01); *H01R 9/24* (2013.01); *H01R 13/2428* (2013.01); *H01R 13/631* (2013.01); *H01R 2201/20* (2013.01)

(58) Field of Classification Search
CPC .... H01R 9/24; H01R 13/2428; H01R 13/631; H01R 31/005; H01R 2201/20; G01R 1/07314; G01R 1/07328
See application file for complete search history.

(56) References Cited

U.S. PATENT DOCUMENTS

| | | | | |
|---|---|---|---|---|
| 5,410,260 A | * | 4/1995 | Kazama | G01R 1/06722 324/755.05 |
| 7,815,473 B2 | * | 10/2010 | Osato | G01R 1/06716 439/700 |
| 9,696,344 B2 | * | 7/2017 | Lee | G01R 1/0416 |
| 10,517,186 B2 | * | 12/2019 | Takahashi | G01R 1/0483 |
| 11,035,883 B2 | * | 6/2021 | Mochizuki | G01R 1/0416 |
| 2019/0064214 A1 | | 2/2019 | Takahashi et al. | |

FOREIGN PATENT DOCUMENTS

JP 2020-17713 A 1/2020

* cited by examiner

*Primary Examiner* — Vanessa Girardi
(74) *Attorney, Agent, or Firm* — Nath, Goldberg & Meyer; Jerald L. Meyer; Tanya E. Harkins

(57) ABSTRACT

A pogo block includes: a conductor having a first terminal connected to a terminal of a board of an inspection part, a second terminal connected to a terminal of a probe card, and an elastically expandable and contractible connection portion connecting the first terminal and the second terminal, and configured to be expandable and contractible in a direction connecting the first terminal and the second terminal; and a housing having a first holder configured to hold the first terminal, a second holder configured to hold the second terminal, and a guider into which the elastically expandable and contractible connection portion is inserted and configured to guide movements of the first holder and the second holder in the direction connecting the first terminal and the second terminal.

16 Claims, 6 Drawing Sheets

POGO BLOCK WITHIN THE INTERMEDIATE CONNECTION MEMBER OF AN INSPECTION SYSTEM

CROSS-REFERENCE TO RELATED APPLICATION

This application is based upon and claims the benefit of priority from Japanese Patent Application No. 2020-058492, filed on Mar. 27, 2020, the entire contents of which are incorporated herein by reference.

TECHNICAL FIELD

The present disclosure relates to a pogo block.

BACKGROUND

Patent Document 1 discloses a technique capable of suppressing misalignment between a pogo frame and a pogo block due to a difference in thermal expansion between the pogo frame and the pogo block.

Prior Art Document

Patent Document

Patent Document 1: Japanese Laid-Open Patent Publication No. 2020-017713

SUMMARY

According to an aspect of the present disclosure, there is provided a pogo block includes: a conductor having a first terminal connected to a terminal of a board of an inspection part, a second terminal connected to a terminal of a probe card, and an elastically expandable and contractible connection portion connecting the first terminal and the second terminal, and configured to be expandable and contractible in a direction connecting the first terminal and the second terminal; and a housing having a first holder configured to hold the first terminal, a second holder configured to hold the second terminal, and a guider into which the elastically expandable and contractible connection portion is inserted and configured to guide movements of the first holder and the second holder in the direction connecting the first terminal and the second terminal.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
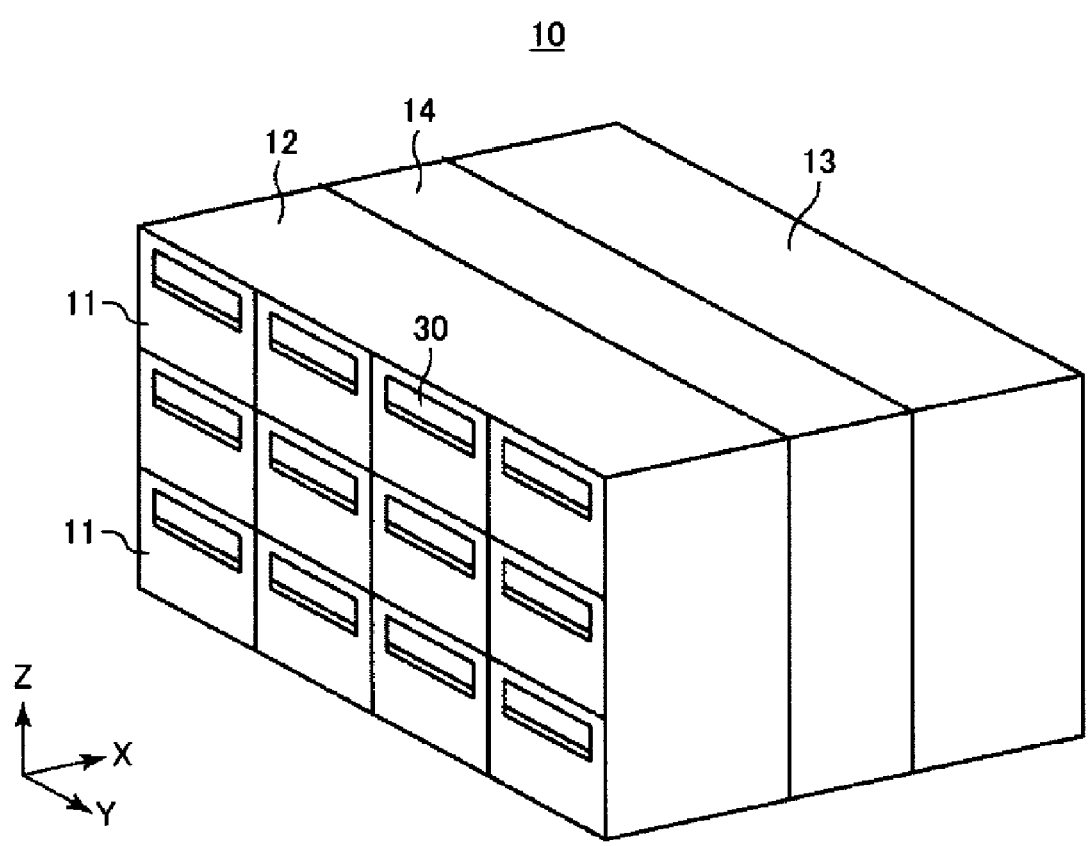
FIG. 1 is a perspective view schematically illustrating an example of an inspection system equipped with a plurality of inspection devices according to an embodiment.

Hereinafter, exemplary embodiments for implementing the present disclosure will be described with reference to the drawings. In the specification and the drawings, components having substantially identical configurations will be denoted by the same reference numerals, and redundant descriptions thereof will be omitted. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Embodiments

FIG. 1 is a perspective view schematically illustrating an example of an inspection system 10 equipped with a plurality of inspection devices according to an embodiment. The inspection system 10 of the present embodiment inspects electrical characteristics of a plurality of devices under test (DUTs) formed on a semiconductor wafer (hereinafter simply referred to as a wafer) W which is an object to be inspected.

The inspection system 10 has a rectangular parallelepiped shape as a whole, and includes an inspection area 12 in which a plurality of inspection rooms (cells) 11 are provided, and a load port area 13 in which the wafer W is loaded into or unloaded from each inspection room 11. In the inspection area 12, four inspection rooms 11 are arranged in the horizontal direction to form a cell row, and three stages of cell rows are arranged in the vertical direction. In addition, a transfer area 14 is provided between the inspection area 12 and the load port area 13. A transfer mechanism (not illustrated) is provided in the transfer area 14 so as to transfer the wafer W between the load port area 13 and each inspection room 11. In each inspection room 11, an inspection device to be described later is provided. A tester 30 constituting a portion of the inspection device is inserted from the front side of the inspection area 12 into each inspection room 11. In FIG. 1, a depth direction of the inspection room 11 refers to as an X direction, an arrangement direction of the inspection rooms 11 refers to as a Y direction, and a height direction of the inspection room 11 refers to as a Z direction.

Figure 2:
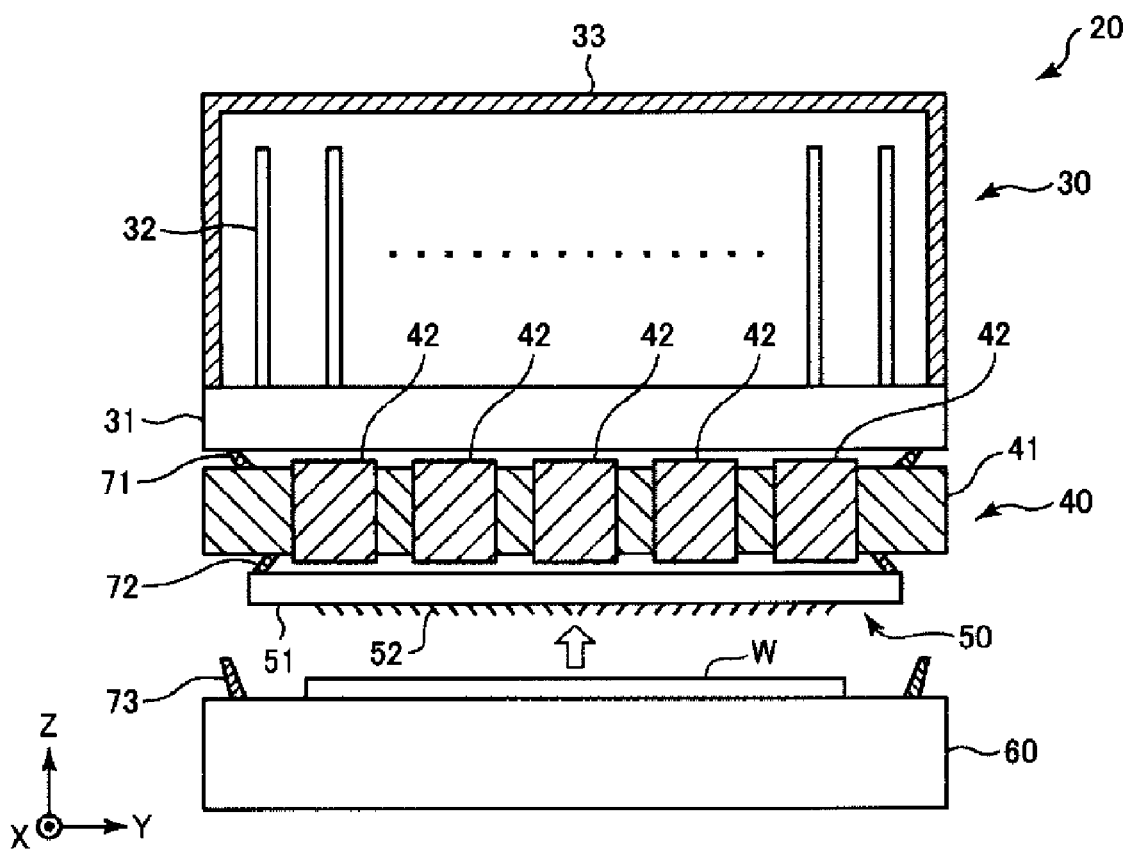
FIG. 2 is view schematically illustrating a configuration of an inspection device provided in an inspection room.

FIG. 2 is a view schematically illustrating a configuration of an inspection device 20 provided in the inspection room 11. The inspection device 20 includes the tester 30, an intermediate connection member 40, and a probe card 50. In the inspection device 20, the inspection of the electrical characteristics of the DUTs formed on the wafer W is performed by the tester 30 through the probe card 50.

The tester 30 is an example of an inspection part, and includes a tester motherboard 31 provided horizontally, a plurality of inspection circuit boards 32 each mounted vertically to slots of the tester motherboard 31, and a housing 33 configured to accommodate the plurality of inspection circuit boards 32. The tester motherboard 31 is an example of a board of the inspection part, and a plurality of terminals (not illustrated) are provided on the bottom of the tester motherboard 31.

The probe card 50 has a plate-shaped base 51 having a plurality of terminals (not illustrated) on the upper surface thereof, and a plurality of probes 52 provided on the bottom surface of the base 51. The plurality of probes 52 are configured to be brought into contact with the DUTs formed on the wafer W. The wafer W is positioned by an aligner (not illustrated) in a state of being attracted to a chuck top (stage) 60, and the respective probes are in contact with the plurality of DUTs.

The intermediate connection member 40 electrically connects the tester 30 and the probe card 50, and includes a pogo frame 41 and a pogo block 42.

Figure 3:
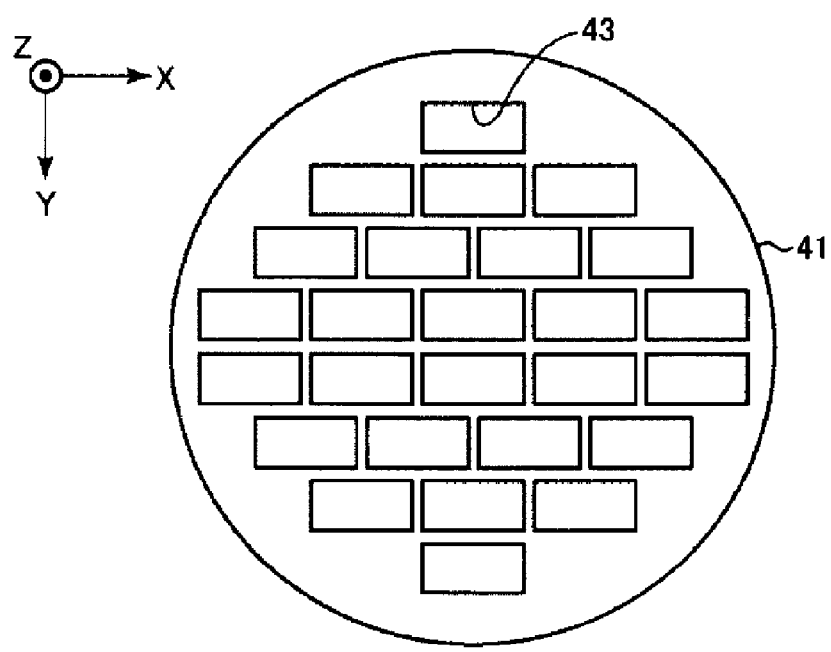
FIG. 3 is a plan view illustrating a pogo frame.

The pogo frame 41 is made of a material having high strength, high rigidity, and a small thermal expansion coefficient, for example, a NiFe alloy. As illustrated in FIG. 3, the pogo frame 41 is provided with a plurality of through-holes 43 each having a rectangular opening, and one pogo block 42 is inserted into each through-hole 43.

As will be described later, the pogo block 42 is positioned with respect to the pogo frame 41, and connects a terminal of the tester motherboard 31 in the tester 30 and a terminal of the base 51 in the probe card 50. The terminal of the tester motherboard 31 is an example of a terminal of the board of the inspection part, and the terminal of the base 51 in the probe card 50 is an example of a terminal of the probe card.

A seal member 71 is provided between the tester motherboard 31 and the pogo frame 41, and a seal member 72 is provided between the pogo frame 41 and the probe card 50. When a space between the tester motherboard 31 and the intermediate connection member 40 is evacuated, the intermediate connection member 40 is attracted to the tester motherboard 31 via the seal member 71. In addition, when a space between the intermediate connection member 40 and the probe card 50 is evacuated, the probe card 50 is attracted to the intermediate connection member 40 (the pogo frame 41) via the seal member 72. Furthermore, a seal member 73 is provided on the upper surface of the chuck top 60 to surround the wafer W. The chuck top 60 is raised by an aligner (not illustrated) provided in each stage so as to bring the probes 52 of the probe card 50 into contact with the electrodes of the DUTs formed on the wafer W. At the same time, the chuck top 60 is attracted by bringing the seal member 73 into contact with the pogo frame 41 of the intermediate connection member 40 and evacuating the space surrounded by the seal member 73.

Figure 4:
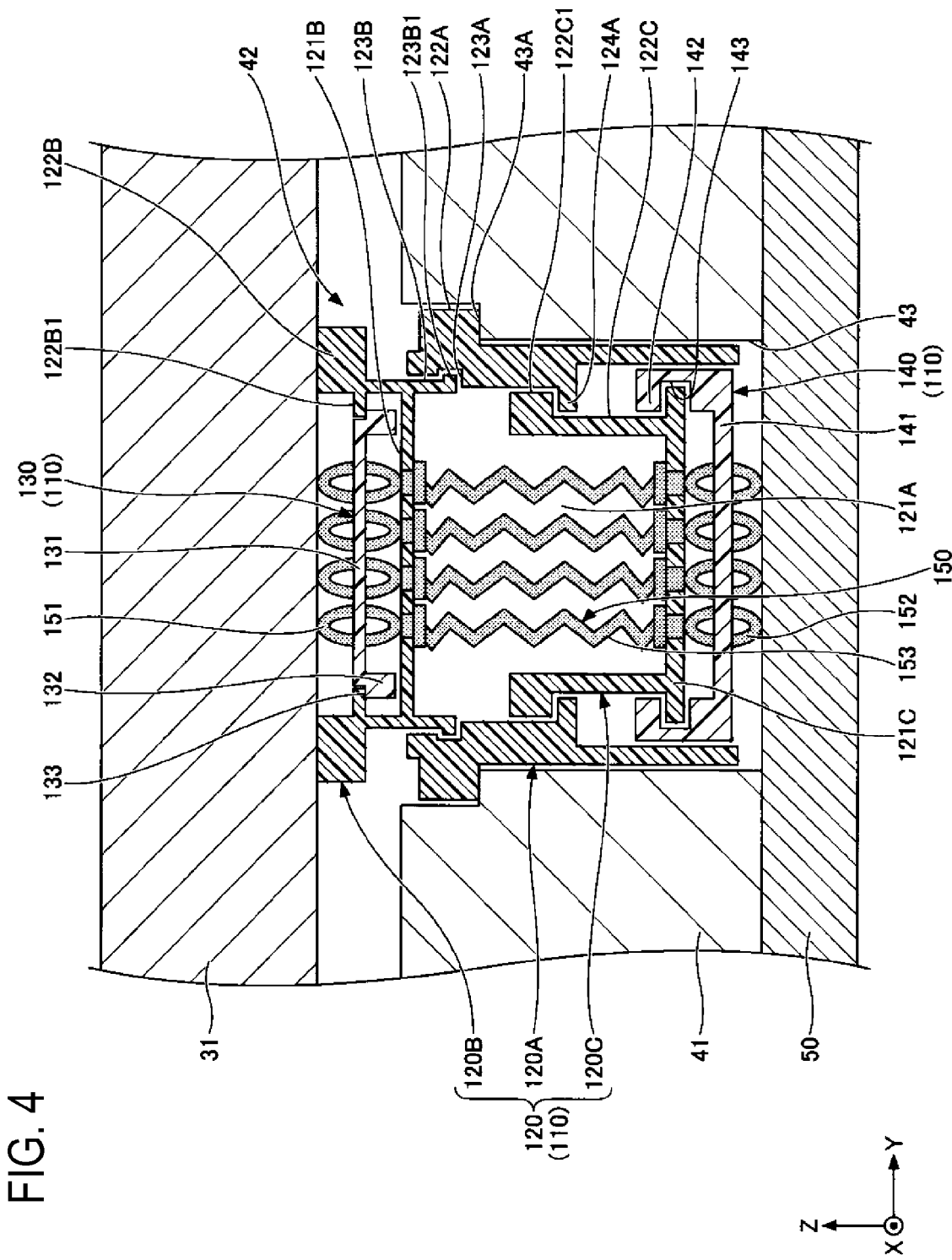
FIG. 4 is a view illustrating a cross-sectional structure of a pogo block and the vicinity thereof.

FIG. 4 is a view illustrating a cross-sectional structure of the pogo block 42 and the vicinity thereof. The cross section illustrated in FIG. 4 is, for example, a cross section parallel to the Y-Z plane. In FIG. 4, as an example, the pogo frame 41 is vacuum-attracted under the tester motherboard 31, and the probe card 50 is vacuum-attracted under the pogo frame 41.

The pogo block 42 includes a housing 110 and a conductor 150. The housing 110 includes a guider 120, a holder 130, and a holder 140. In this regard, the guider 120, the holder 130, and the holder 140 will be denoted with reference numeral 110 shown in parentheses. The holder 130 is an example of a first holder, and the holder 140 is an example of a second holder. The guider 120, the holder 130, and the holder 140 are, for example, resin-made members, but may be metal-made members each having an insulating coating film formed on the surface thereof.

The guider 120 include a main body 120A, a movable portion 120B, and a movable portion 120C. The movable portion 120B is an example of a first movable portion, and the movable portion 120C is an example of a second movable portion.

The main body 120A has a rectangular parallelepiped outer shape and has a through-hole 121A penetrating the main body 120A in the vertical direction. The through-hole 121A has a substantially rectangular shape in a plan view. The circumference (four sides) of the through-hole 121A is surrounded by the wall of the main body 120A. A connection portion 153 of the conductor 150 is inserted into the through-hole 121A.

A height of the main body 120A in the Z direction is lower than that of the pogo frame 41. Upper and lower ends of the main body 120A are received in the through-hole 43. That is, the upper end of the main body 120A is located at a position lower than the upper surface of the pogo frame 41 so as not to protrude upward from the upper surface of the pogo frame 41, and the lower end of the main body 120A is located above the bottom surface of the pogo frame 41 so as not to be in contact with the probe card 50. There is a gap between the lower end of the main body 120A and the probe card 50.

Hereinafter, regarding the positional relationship of each component of the pogo block 42 in the Y direction, sides in ±Y direction of the pogo block 42 when viewed from the center side in the Y direction will be referred to as a Y-direction outward side. In addition, the central side of the pogo block 42 when viewed from the Y-direction outward side will be referred to as a Y-direction inward side.

The main body 120A includes a convex portion 122A, a concave portion 123A, and a convex portion 124A in addition to the through-hole 121A. The convex portion 122A is a portion protruding in the Y-direction outward side on the upper end side of the outer surface of the main body 120A. The inner wall of the through-hole 43 is provided with a stepped portion 43A corresponding to the convex portion 122A. The through-hole 43 has a large opening formed above the stepped portion 43A in a plan view, and a small opening formed below the stepped portion 43A in a plan view. That is, in the inner wall surface of the through-hole 43, the lower side of the stepped portion 43A is located more the Y-direction inward side than the upper side of the stepped portion 43A.

The convex portion 122A is engaged with the stepped portion 43A. When the pogo block 42 is inserted into the through-hole 43 from above, vertical positioning of the pogo block 42 with respect to the pogo frame 41 is performed in the state in which the convex portion 122A is engaged with the stepped portion 43A.

The concave portion 123A is a portion that is recessed to the Y-direction outward side from the inner surface of the main body 120A facing the through-hole 121A, and is provided, for example, at substantially the same height as the convex portion 122A. The concave portion 123A is engaged with the convex portion 123B1 protruding to the Y-direction outward side at the lower end of the extended portion 123B of the movable portion 120B. The vertical length of the concave portion 123A (vertical length (interval) between the upper surface (upper end) and the lower surface (lower end) of the concave portion 123A) is larger than the vertical length of the convex portion 123B1. The convex portion 123B1 is movable in the vertical direction between the lower end and the upper end of the concave portion 123A.

The convex portion 124A is a portion that protrudes to the Y-direction inward side from the inner surface of the main body 120A below the convex portion 122A and the concave portion 123A. The vertical position of the convex portion 124A is aligned with the position of the convex portion 122C1 protruding to the Y-direction outward side from the upper end of an extended portion 122C of the movable portion 120C. The convex portion 122C1 at the upper end of the extended portion 122C of the movable portion 120C is engaged with the convex portion 124A.

The movable portion 120B includes a base portion 121B, a contact portion 122B, and an extended portion 123B, and is located above the main body 120A. The base portion 121B is provided at the upper side of the through-hole 121A in the main body 120A, and is a plate-shaped member that extends in the X direction and has a length in the Y direction corresponding to a width in the Y direction above the concave portion 123A in the through-hole 121A. The base portion 121B has a plurality of through-holes formed to penetrate the base portion 121B in the vertical direction. Upper ends of the connection portions 153 of the plurality of conductors 150 are inserted into the plurality of through-holes. The base portion 121 and the upper ends of the connection portions 153 are fixed. In addition, the base portion 121B has portions bent upward at the both end sides in the Y direction.

The contact portion 122B is connected to the portions of the base portion 121B that are bent upward at the both end sides in the Y direction. The contact portion 122B is a beam-like portion extending in the X direction. As an example, the contact portion 122B has a rectangular cross-sectional shape parallel to the Y-Z plane. An upper surface of the contact portion 122B is brought into contact with a lower surface of the tester motherboard 31.

The contact portion 122B has a convex portion 122B1 protruding to the Y-direction inward side from a lower end of the contact portion 122B. The convex portion 122B1 has a shape corresponding to the holder 130.

The extended portion 123B extends downward from both ends of the base portion 121B in the Y direction. The convex portion 123B1 protruding to the Y-direction outward side at a lower end of the extended portion 123B is engaged with the concave portion 123A of the main body 120A.

In the movable portion 120B having the configuration described above, the extended portion 123B is movable in the vertical direction with respect to the main body 120A within a range between the upper surface and the lower surface of the concave portion 123A of the main body 120A.

The movable portion 120C includes a base portion 121C and an extended portion 122C, and is provided below the movable portion 120B within the through-hole 121A in the main body 120A. The base portion 121C is a plate-shaped member having a length in the Y direction, which corresponds to an inner dimension of the concave portion 143 of the holder 140 in the Y direction, and extending in the X direction. The base portion 121C has a plurality of through-holes penetrating the base portion 121C in the vertical direction. Lower ends of the connection portions 153 of the plurality of conductors 150 are inserted into the plurality of through-holes, respectively. The base portion 121C and the lower ends of the connection portions 153 are fixed.

The extended portion 122C extends upward from both ends of the base portion 121C in the Y direction. The extended portion 122C is a plate-shaped member extending in the X direction. A convex portion 122C1 protruding to the Y-direction outward side is provided at the upper end of the extended portion 122C. The convex portion 122C1 is engaged with the convex portion 124A of the main body 120A.

The movable portion 120C having the configuration described above is movable upward with respect to the main body 120A from a position at which the lower end of the convex portion 122C1 and the upper surface of the convex portion 124A of the main body 120A are engaged with each other.

The holder 130 includes a base portion 131 and a stopper 132. The base portion 131 is a plate-shaped member parallel to the X-Y plane. The stopper 132 is an example of a first limiter, and is a beam-shaped portion extending downward from both ends of the base portion 131 in the Y direction and extending in the X direction.

The base portion 131 is provided with a plurality of through-holes penetrating the base portion 131 in the vertical direction. Terminals 151 of the conductors 150 are inserted into and fixed to the through-holes, respectively. The stopper 132 protrudes to the Y-direction outward side from the both ends of the base portion 131 in the Y direction. A stepped portion 133 is formed in the protruded portion. The stopper 132 is provided to limit the downward movement of the holder 130. The stepped portion 133 is provided to limit the upward movement of the holder 130.

With respect to the movable portion 120B, the holder 130 is movable in the vertical direction between a position at which the stepped portion 133 is brought into contact with the bottom surface of the convex portion 122B1 and a position at which the stopper 132 is brought into contact with the upper surface of the base portion 121B of the movable portion 120B. In other words, the movable portion 120B guides the holder 130 so as to be movable in the vertical direction within the limited range in the vertical direction.

The holder 140 includes a base portion 141, an extended portion 142, and a concave portion 143. The base portion 141 is a plate-shaped portion having a length in the Y direction, which corresponds to a length of the lower end of the through-hole 121A in the main body 120A in the Y direction, and extending in the X direction. The base portion 141 is provided with a plurality of through-holes penetrating the base portion 141 in the vertical direction. Terminals 152 are inserted into and fixed to the through-holes, respectively.

The extended portion 142 is a beam-shaped portion extending upward from both ends of the base portion 141 in the Y direction and extending in the X direction. A concave portion 143 recessed to the Y-direction outward side is provided inside the extended portion 142 in the Y direction. A lower surface (lower end) of the concave portion 143 is located at a position higher than an upper surface of the base portion 141. Both ends of the base portion 121C of the movable portion 120C are inserted into the concave portion 143 provided at both sides in the Y direction. A length (thickness) of the base portion 121C in the Z direction is smaller than a length (interval) between an upper surface (upper end) and a lower surface (lower end) of the concave portion 143 in the vertical direction.

Therefore, with respect to the movable portion 120C, the holder 140 is movable between a position at which the lower surface of the concave portion 143 is brought into contact with the bottom surfaces of the both ends of the base portion 121C and a position at which the upper surface of the concave portion 143 is brought into contact with the upper surfaces of the both ends of the base portion 121C. In other words, the movable portion 120C guides the holder 140 so as to be movable in the vertical direction within the limited range in the vertical direction.

The plurality of conductors 150, which are expandable and contractible in the vertical direction, are provided between the upper end and the lower end of the pogo block 42. Each conductor 150 is, for example, a wire made of a conductive material. As an example, the conductor 150 may be manufactured by a metal such as copper (Cu), gold (Au), silver (Ag), nickel (Ni), or tungsten (W), or an alloy such as beryllium copper (BeCu). The conductor 150 may be a bare metal or alloy, or may be covered with an insulating film or the like. The plurality of conductors 150 may be insulated from each other.

Each conductor 150 includes the terminal 151, the terminal 152, and the connection portion 153. The terminal 151 is an example of a first terminal, and the terminal 152 is an example of a second terminal. The terminals 151 and 152 may have any shape as long as they are spring members that are elastically expandable and contractible in the vertical direction. As an example, the terminals 151 and 152 may be elliptical terminals when viewed in the Y-Z plane. Further, the terminals 151 and 152 may be electrical contacts which are expandable and contractible in the vertical direction and having no elasticity like the spring member.

As illustrated in FIG. 4, the upper ends of the terminals 151 are pressed against and come into contact with terminals provided on the bottom surface of the tester motherboard 31 in the state in which the pogo frame 41 on which the pogo block 42 is mounted is vacuum-attracted to the bottom of the tester motherboard 31. In this state, the terminals 151 are contracted in the vertical direction with respect to its original length. The lower ends of the terminals 151 are connected to the upper ends of the connection portions 153. The central portions of the terminals 151 are fixed in the state of being inserted into the respective through-holes of the base portion 131 of the holder 130.

The upper ends of the terminals 152 are connected to the lower ends of the connection portions 153, respectively. The lower ends of the terminals 152 are pressed against and come into contact with the terminals provided on the upper surface of the probe card 50 in the state in which the probe card 50 is vacuum-attracted to the pogo frame 41 on which the pogo block 42 is mounted. In this state, the terminals 152 are contracted in the vertical direction with respect to its original length. The central portions of the terminals 152 are fixed in the state of being inserted into the respective through-holes of the base portion 141 of the holder 140.

The connection portions 153 are spring members like the terminals 151 and 152. The upper ends of the connection portions 153 are connected to the terminals 151, respectively, and the lower ends thereof are connected to the terminals 152, respectively. The connection portions 153 may be formed integrally with the terminals 151 and 152, or may be formed separately from the terminals 151 and 152 and then connected to the terminals 151 and 152 by welding, soldering, or the like. The upper ends of the connection portions 153 are fixed while being inserted into the respective through-holes of the base portion 121B of the movable portion 120B, and the lower ends of the connection portions 153 are fixed while being inserted into the respective through-holes of the base portion 121C of the movable portion 120C.

In each of the conductors 150 configured as described above, the terminal 151 biases the holder 130 upward with respect to the base portion 121B. The connection portion 153 biases the movable portion 120B and the movable portion 120C in a direction in which the movable portions 120B and 120C are spaced apart from each other in the vertical direction. In addition, the terminal 152 biases the holder 140 downward with respect to the movable portion 120C.

Here, the spring constant of the connection portion 153 is greater than or equal to the spring constant of each of the terminals 151 and 152. As an example, the spring constant of the connection portion 153 is preferably greater than the spring constant of each of the terminals 151 and 152. When the central portion of the tester motherboard 31 in a plan view warps downward, a distribution in an interval between the tester motherboard 31 and the probe card 50 in a plan view occurs. The narrower the interval, the greater the pressing force applied to the pogo block 42.

The reason for making the spring constants have the relationship described above is to make the terminals 151 and 152 expand and contract so as to easily respond to the interval when such an interval distribution occurs. In addition, the reason is to make the holders 130 and 140 more easily movable in the vertical direction than the movable portions 120B and 120C when such an interval distribution occurs, thereby responding to the interval distribution with the movements of the holders 130 and 140 when the pressing force is relatively small. Furthermore, the reason is to easily respond to various intervals by moving the movable portions 120B and 120C when such an interval distribution occurs and the pressing force is relatively great.

The pogo block 42 having the configuration described above is capable of performing the following operations.

When the contact portion 122B of the movable portion 120B is pressed against the bottom surface of the tester motherboard 31 while being brought into contact with the bottom surface, the terminals 151 are pressed against the terminals of the bottom surface of the tester motherboard 31, the terminals 151 are deformed. As the pressing force increases, the holder 130 moves downward with respect to the movable portion 120B. Further, as the pressing force further increases, the movable portion 120B moves downward with respect to the main body 120A. When the stopper 132 is brought into contact with the base portion 121B, the downward movement of the holder 130 with respect to the movable portion 120B becomes limited, and when the bottom surface of the convex portion 123B1 is brought into contact with the lower surface of the concave portion 123A, the downward movement of the movable portion 120B with respect to the main body 120 becomes limited. Whether the contact of the stopper 132 with the base portion 121B or the downward movement of the movable portion 120B with respect to the main body 120A occurs first depends on the relationship between the spring constants of each of the terminals 151 and 152 and the connection portion 153.

In addition, when the tip (lower end) of the terminal 152 is pressed against the terminal of the probe card 50, the terminal 152 is deformed. As the pressing force increases, the holder 140 moves upward with respect to the movable portion 120C. In addition, as the pressing force further increases, the movable portion 120C moves upward with respect to the main body 120A. When the lower surface of the concave portion 143 is brought into contact with the bottom surfaces of the both ends of the base portion 121C, the movement of the holder 140 with respect to the movable portion 120c becomes limited. Whether the contact of the lower surface of the concave portion 143 with the bottom surfaces of the both ends of the base portion 121c or the upward moment of the movable portion 120c with respect to the main body 120A occurs first depends on the relationship between the spring constants of each of the terminals 151 and 152 and the connection portion 153.

Figure 5:
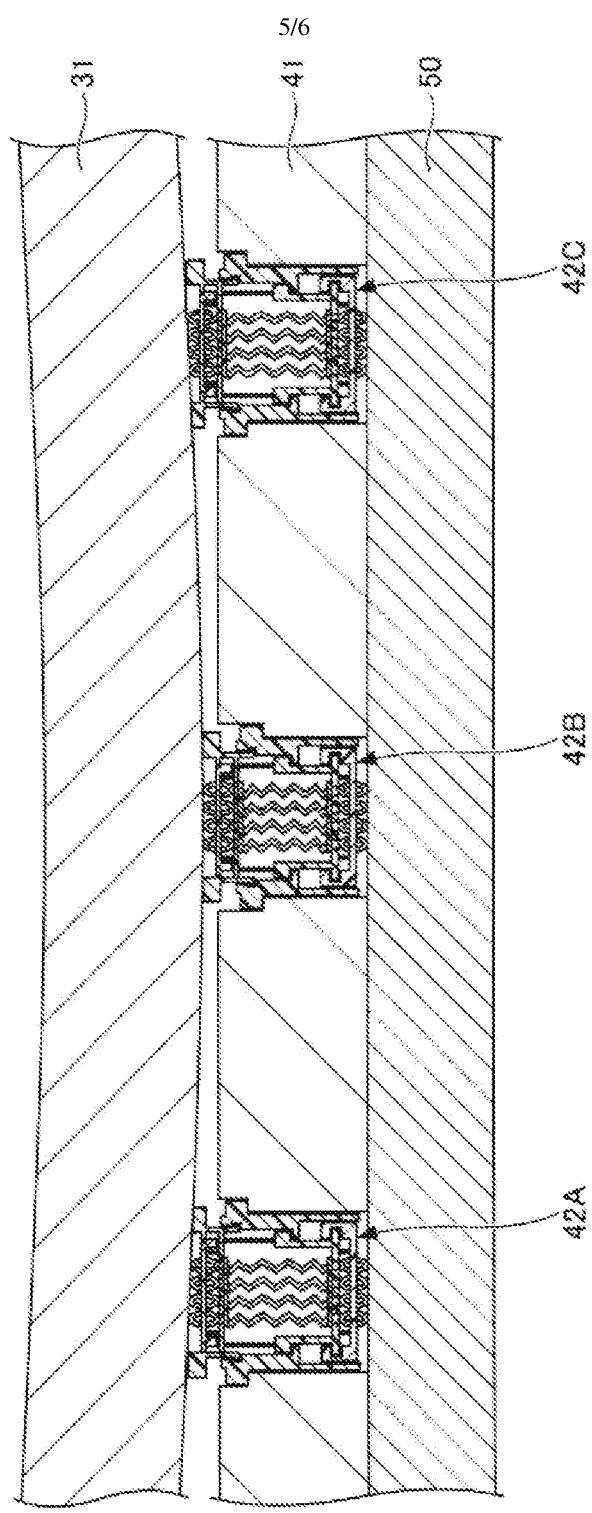
FIG. 5 is a view illustrating a state in which pogo blocks expand and contract according to warpage of a tester motherboard.

FIG. 5 is a view illustrating a state in which the pogo blocks 42A, 42B, and 42C expand and contract to correspond to the warpage of the tester motherboard 31. Here, as an example, all the three pogo blocks 42A, 42B, and 42C are similar to the pogo block 42 illustrated in FIG. 4, and are illustrated briefly in FIG. 5.

As an example, the tester motherboard 31 is warped with respect to the pogo blocks 42A, 42B, and 42C arranged in the Y direction, and the interval between the tester motherboard 31 and the probe card 50 is the narrowest in a portion corresponding to the pogo block 42B. In this case, between the tester motherboard 31 and the probe card 50, the pogo block 42B contracts, and the pogo blocks 42A and 42C do not contract as much as the pogo block 42B. There may a case in which the pogo blocks 42A and 42C expand in the vertical direction from the state before the tester motherboard 31 is warped.

As described above, even if a distribution in the interval between the tester motherboard 31 and the probe card 50 occurs due to the warpage of the tester motherboard 31, the pogo blocks 42A, 42B, and 42C expand and contract so as to correspond to the interval distribution so that vertical lengths of the pogo blocks 42A, 42B, and 42C are adjusted. As a result, the pogo blocks 42A, 42B, and 42C are capable of connecting the terminals of the bottom surface of the tester motherboard 31 and the terminals of the upper surface of the probe card 50 in a reliable manner Therefore, it is possible to ensure the electrical connection between the tester motherboard 31 and the probe card 50.

Therefore, it is possible to provide the pogo block 42 that is capable of ensuring the electrical connection between the tester motherboard 31 (the board of the inspection part) and the probe card 50 by expanding and contracting so as to correspond to the warpage of the tester motherboard 31 (the board of the inspection part).

Figure 6:
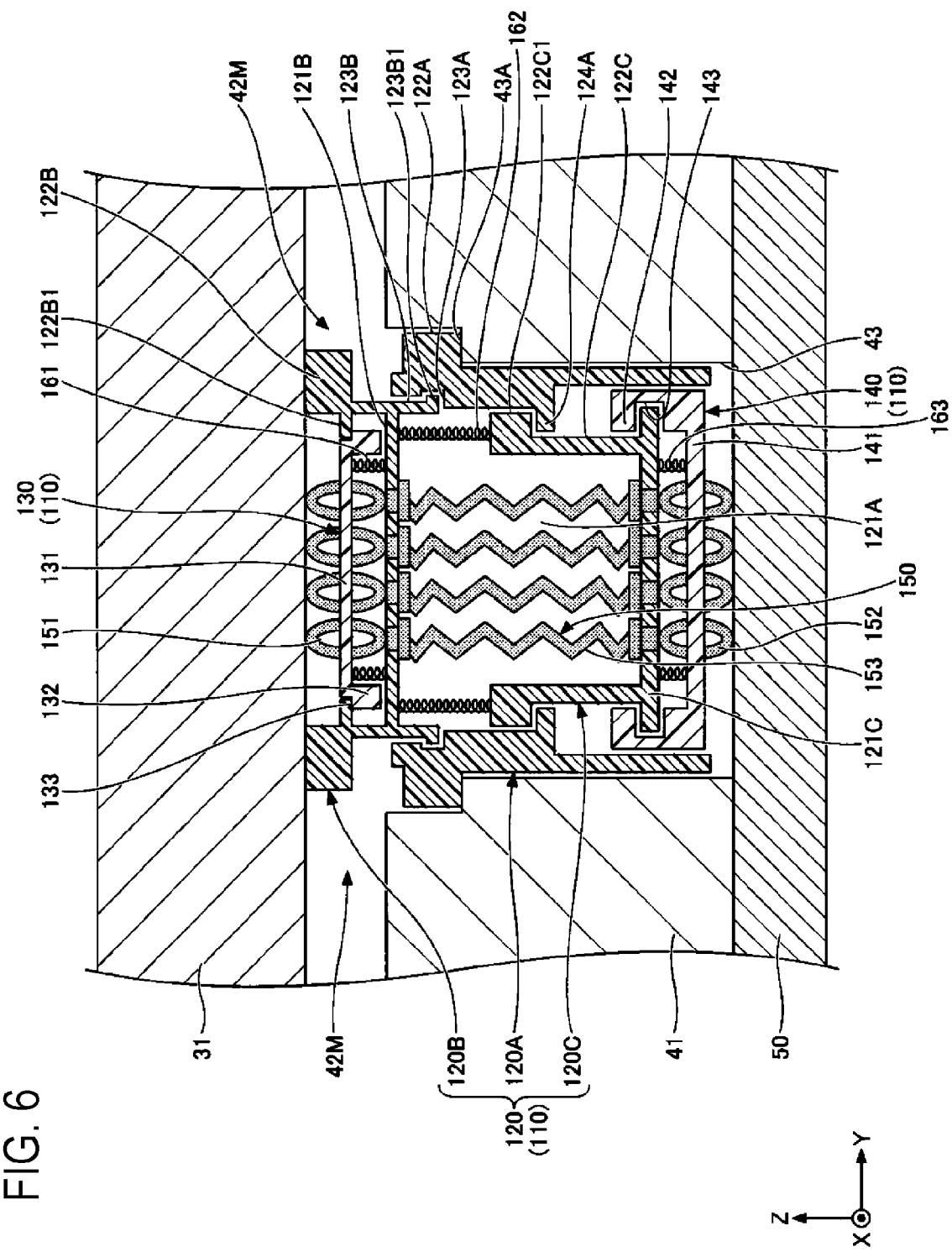
FIG. 6 is a view illustrating a pogo block according to a modification of the embodiment.

Although the embodiment in which the pogo blocks 42A, 42B, and 42C include the elastically expandable/contractible conductors 150 has been described above, a configuration illustrated in FIG. 6 may be adopted. FIG. 6 is a view illustrating a pogo block 42M according to a modification of the embodiment.

The pogo block 42M has a configuration in which the conductors 150 (the terminals 151 and 152 and the connection portions 153) of the pogo block 42 illustrated in FIG. 4 are changed to wire-shaped conductors having non-elastic metallicity and springs 161 to 163 are additionally provided. The springs 161 to 163 are examples of elastic members.

The spring 161 is provided between the base portion 131 of the holder 130 and the base portion 121B of the movable portion 120B, and the spring 162 is provided between the base portion 121B of the movable portion 120B and the upper surface of the extended portion 122C of the movable portion 120C. In addition, the spring 163 is provided between the base portion 121C of the movable portion 120C and the base portion 141 of the holder 140.

The spring 161 is located between the movable portion 120B and the holder 130 to elastically support the movable portion 120B and the holder 130, the spring 162 is located between the movable portion 120B and the movable portion 120C to elastically support the movable portion 120B and the movable portion 120C, and the spring 163 is located between the movable portion 120C and the holder 140 to elastically support the movable portion 120C and the holder 140. Therefore, similarly to the pogo block 42 illustrated in FIG. 4, the pogo block 42M illustrated in FIG. 6 can be adjusted in vertical length by expanding and contracting so as to correspond to the distribution in the interval between the tester motherboard 31 and the probe card 50. As a result, the pogo block 42M is capable of connecting the terminals of the bottom surface of the tester motherboard 31 and the terminals of the upper surface of the probe card 50 in a reliable manner Therefore, it is possible to ensure the electrical connection between the tester motherboard 31 and the probe card 50.

Therefore, it is possible to provide the pogo block 42M that is capable of ensuring the electrical connection between the tester motherboard 31 (the board of the inspection part) and the probe card 50 by expanding and contracting so as to correspond to the warpage of the tester motherboard 31 (the board of the inspection part).

In addition, at least one of the three springs 161 to 163 may be omitted, and the conductor 150 may be configured to further have elasticity corresponding to the omitted spring(s).

According to an aspect, it is possible to ensure an electrical connection between a board of an inspection part and a probe card by expanding and contracting a pogo block so as to correspond to warpage of the board of the inspection part.

Although the embodiments of the pogo block according to the present disclosure have been described above, the present disclosure is not limited to the above-described embodiments or the like. Various changes, modifications, substitutions, additions, deletions, and combinations can be made within the scope of the claims. Of course, they also belong to the technical scope of the present disclosure.

What is claimed is:

1. A pogo block comprising:
   a conductor comprising a first terminal connected to a terminal of a board of an inspection part, a second terminal connected to a terminal of a probe card, and an elastically expandable and contractible connection portion connecting the first terminal and the second terminal, and configured to be expandable and contractible in a direction connecting the first terminal and the second terminal; and
   a housing comprising a first holder configured to hold the first terminal, a second holder configured to hold the second terminal, and a guider into which the elastically expandable and contractible connection portion is inserted and configured to guide movements of the first holder and the second holder in the direction connecting the first terminal and the second terminal.

2. The pogo block of claim 1, wherein the first holder comprises a first limiter configured to restrict a movement of the guider towards the second terminal in the direction connecting the first terminal and the second terminal.

3. The pogo block of claim 1, wherein the second holder comprises a second limiter configured to restrict a movement of the guider towards the first terminal in the direction connecting the first terminal and the second terminal.

4. The pogo block of claim 1, wherein the first terminal, the second terminal, and the connection portion are made of a metal spring, and
   the connection portion has a spring constant greater than each of the spring constants of the first terminal and the second terminal.

5. The pogo block of claim 1, wherein the conductor is a wire.

6. The pogo block of claim 1, wherein the guider comprises:
   a main body; and
   a first movable portion configured to be movable with respect to the main body in the direction connecting the first terminal and the second terminal and to guide the movement of the first holder in the direction connecting the first terminal and the second terminal.

7. The pogo block of claim 6, wherein the first movable portion includes a contact portion which is brought into contact with the board of the inspection part.

8. The pogo block of claim 6, wherein the guider further comprises a second movable portion configured to be movable with respect to the main body in the direction connecting the first terminal and the second terminal and to guide the movement of the second holder in the direction connecting the first terminal and the second terminal.

9. A pogo block comprising:
- a conductor comprising a first terminal connected to a terminal of a board of an inspection part, a second terminal connected to a terminal of a probe card, and a connection portion configured to connect the first terminal and the second terminal, and configured to be expandable and contractible in a direction connecting the first terminal and the second terminal;
- a housing comprising a first holder configured to hold the first terminal, a second holder configured to hold the second terminal, and a guider into which the connection portion is inserted and configured to guide movements of the first holder and the second holder in the direction connecting the first terminal and the second terminal; and
- an elastic member configured to elastically support the first holder, the second holder, and the guider in the direction connecting the first terminal and the second terminal.

10. The pogo block of claim 9, wherein the first holder comprises a first limiter configured to restrict a movement of the guider towards the second terminal in the direction connecting the first terminal and the second terminal.

11. The pogo block of claim 9, wherein the second holder comprises a second limiter configured to restrict a movement of the guider towards the first terminal in the direction connecting the first terminal and the second terminal.

12. The pogo block of claim 9, wherein the first terminal, the second terminal, and the connection portion are made of a metal spring, and
- the connection portion has a spring constant greater than each of the spring constants of the first terminal and the second terminal.

13. The pogo block of claim 9, wherein the conductor is a wire.

14. The pogo block of claim 9, wherein the guider comprises:
- a main body; and
- a first movable portion configured to be movable with respect to the main body in the direction connecting the first terminal and the second terminal and to guide the movement of the first holder in the direction connecting the first terminal and the second terminal.

15. The pogo block of claim 14, wherein the first movable portion includes a contact portion which is brought into contact with the board of the inspection part.

16. The pogo block of claim 14, wherein the guider further comprises a second movable portion configured to be movable with respect to the main body in the direction connecting the first terminal and the second terminal and to guide the movement of the second holder in the direction connecting the first terminal and the second terminal.

* * * * *